United States Patent
El-Tanani et al.

(10) Patent No.: US 11,264,517 B2
(45) Date of Patent: Mar. 1, 2022

(54) CMOS VARACTOR WITH INCREASED TUNING RANGE

(71) Applicant: INTEL CORPORATION, Santa Clara, CA (US)

(72) Inventors: Mohammed El-Tanani, Hillsboro, OR (US); Paul Packan, Beaverton, OR (US); Jami Wiedemer, Beaverton, OR (US); Andrey Mezhiba, Portland, OR (US); Yonping Fan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 253 days.

(21) Appl. No.: 15/525,878

(22) PCT Filed: Dec. 24, 2014

(86) PCT No.: PCT/US2014/072394
§ 371 (c)(1),
(2) Date: May 10, 2017

(87) PCT Pub. No.: WO2016/105424
PCT Pub. Date: Jun. 30, 2016

(65) Prior Publication Data
US 2017/0330977 A1    Nov. 16, 2017

(51) Int. Cl.
*H03B 5/12* (2006.01)
*H03B 5/24* (2006.01)
(Continued)

(52) U.S. Cl.
CPC .......... *H01L 29/94* (2013.01); *H01L 29/0657* (2013.01); *H01L 29/0688* (2013.01);
(Continued)

(58) Field of Classification Search
CPC . H01L 29/94; H01L 29/0657; H01L 29/0688; H01L 29/417; H01L 29/45;
(Continued)

(56) References Cited

U.S. PATENT DOCUMENTS

| 6,100,770 A | 8/2000 | Litwin et al. |
| 7,276,746 B1 | 10/2007 | Xu |

(Continued)

FOREIGN PATENT DOCUMENTS

| WO | WO 2003/032431 | 4/2003 | |
| WO | WO-2013074076 A1 * | 5/2013 | ........... H01L 27/088 |

OTHER PUBLICATIONS

International Searching Authority At the Korean Intellectual Property Office, International Search Report and Written Opinion for International Patent Application No. PCT/US2014/072394, dated Sep. 24, 2015, 17 pages.

(Continued)

*Primary Examiner* — Richard Tan
(74) *Attorney, Agent, or Firm* — Schwabe, Williamson & Wyatt, P.C.

(57) ABSTRACT

A varactor is described that may be constructed in CMOS and has a high tuning range. In some embodiments, the varactor includes a well, a plurality of gates formed over the well and having a capacitive connection to the well, the gates comprising a first subset of the gates that are adjacent and consecutive and coupled to a positive pole of an excitation oscillation signal, and a second subset of the gates that are adjacent and consecutive and coupled to a negative pole of the excitation oscillation signal, and a plurality of source/drain terminals formed over the well and having an ohmic connection to the well, each coupled to a respective gate to receive a control voltage to control the capacitance of the varactor.

4 Claims, 4 Drawing Sheets

(51) Int. Cl.
*H01L 29/94* (2006.01)
*H01L 29/06* (2006.01)
*H01L 29/417* (2006.01)
*H01L 29/45* (2006.01)
*H03B 5/00* (2006.01)
*H01L 29/78* (2006.01)

(52) U.S. Cl.
CPC ........ *H01L 29/0692* (2013.01); *H01L 29/417* (2013.01); *H01L 29/45* (2013.01); *H03B 5/00* (2013.01); *H01L 29/785* (2013.01); *H03B 2200/004* (2013.01)

(58) Field of Classification Search
CPC ..... H01L 29/0692; H01L 29/785; H03B 5/00; H03B 2200/004
USPC .................................. 331/36 C, 36 R, 108 R
See application file for complete search history.

(56) References Cited

U.S. PATENT DOCUMENTS

| | | | |
|---|---|---|---|
| 7,477,113 | B1 | 1/2009 | Hughes |
| 8,115,281 | B2* | 2/2012 | Pawlikiewicz ... H01L 29/66174 257/595 |
| 8,273,616 | B2* | 9/2012 | Chen .................. H01L 29/7391 257/E21.632 |
| 2001/0045597 | A1* | 11/2001 | Nishinohara ..... H01L 29/66545 257/329 |
| 2002/0044012 | A1 | 4/2002 | Otsuka et al. |
| 2006/0006431 | A1 | 1/2006 | Jean et al. |
| 2009/0091380 | A1 | 4/2009 | Min et al. |
| 2013/0295734 | A1* | 11/2013 | Niebojewski ..... H01L 29/66477 438/197 |
| 2014/0008732 | A1 | 1/2014 | Hyvonen et al. |
| 2014/0117501 | A1* | 5/2014 | Yen ..................... H01L 23/5223 257/535 |
| 2014/0264628 | A1* | 9/2014 | Lin ..................... H01L 27/0808 257/401 |
| 2016/0149057 | A1* | 5/2016 | Yoo ........................ H01L 29/94 257/296 |

OTHER PUBLICATIONS

Tasic, et al., Design of Multistandard Adaptive Voltage-Controlled Oscillators, Feb. 2015, pp. 556-563, vol. 53, No. 2, IEEE Transactions on Microwave Theory and Techniques.
Office Action from Taiwan Patent Application No. 104138556, dated Aug. 19, 2020, 12 pages.
Office Action from Taiwan Patent Application No. 104138556, dated Jan. 3, 2020. 2 pgs.
International Preliminary Report on Patentability for International Patent Application No. PCT/US2014/072394, dated Jul. 6, 2017, 13 pages.
Search Report from European Patent Application No. 14909264.5, dated Jul. 30, 2018, 9 pgs.
Office Action from Chinese Patent Application No. 201480083617.2, dated Jul. 10, 2020, 8pgs.
Office Action from Chinese Patent Application No. 201480083617.2, dated Jul. 13, 2020, 11 pgs.
Office Action from Korean Patent Application No. 10-2017-7014150, dated Mar. 31, 2021, 10 pgs.
Notice of Allowance from Chinese Patent Application No. 201480083617.2, dated Dec. 8, 2020, 4 pgs.
Final Office Action from Korean Patent Application No. 10-2017-7014150 dated Oct. 25, 2021, 4 pgs.
Office Action from Korean Patent Application No. 10-2017-7014150 dated Dec. 13, 2021, 23 pgs.

* cited by examiner

CMOS VARACTOR WITH INCREASED TUNING RANGE

CROSS-REFERENCE TO RELATED APPLICATION

This patent application is a U.S. National Phase Application under 35 U.S.C. § 371 of International Application No. PCT/US2014/072394, filed Dec. 24, 2014, entitled CMOS VARACTOR WITH INCREASED TUNING RANGE.

FIELD

The present description relates to the field of variable capacitors in integrated circuit CMOS structures.

BACKGROUND

A varactor provides a variable capacitance that can be controlled with a control voltage applied on a terminal of the varactor. Varactors are particularly useful in radio frequency circuits for tuning a circuit to oscillate at a particular frequency, but varactors are used in many other applications as well. Capacitors in general and varactors in particular operate on a principle of using two conductive plates or surfaces with an insulator in between.

Varactors typically vary the electrical capacitance on one of the terminals (the signal terminal) in response to the voltage level on the other terminal (the control terminal). In CMOS (Complementary Metal Oxide Semiconductor) technology varactors are typically built with an NMOS (n-type CMOS) in an N-type well. The intrinsic MOS gate capacitance of the MOS device is used as the varied capacitance, the gate terminal being the signal terminal and the N-well potential being used to vary the capacitance. The source and drain terminals are ohmically connected to the N-well and are used as control terminals.

A CMOS varactor has several sources of parasitic capacitances. For example, there is a fringe capacitance from the gate to the raised source/drain structures and from the gate to the source/drain contact elements. These fringe capacitances form a fixed capacitance that is not varied by the control voltage and increases the varactor capacitance at every control voltage level by a fixed amount. These parasitic capacitances increase the capacitance seen on the signal terminal and restrict the tuning range of the varactor devices as measured by a Cmax/Cmin ratio (maximum to minimum capacitance ratio). The relative contribution of the fixed capacitance to the overall varactor capacitance increases as the device gate length is scaled down in more advanced CMOS processes, decreasing the Cmax/Cmin of the varactor.

With further scaling in the features of integrated circuits, channel lengths are reduced. Smaller channel varactors have a smaller Cmax/Cmin ratio due to the comparatively larger fixed Cfringe component of the capacitance of the varactor.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

In embodiments, the fringe capacitance of a varactor may be reduced by reducing the raised source/drain structures of a varactor, for example by removing epitaxial layers in the source and drain regions of the varactor. By reducing the fringe capacitance components, the minimum capacitance of the varactor is reduced. Further reductions may be obtained by selectively omitting source/drain contacts and by using certain combinations of even and odd mode excitation schemes.

With higher speed input/output systems, such as PCIe (Peripheral Component Interconnect Express), KTI (Keizer Technology Interface), USB (Universal Serial Bus), DisplayPort, and Serdes (Serializer Deserializer), jitter must be further reduced. A wide tuning range varactor may be used for many such high speed I/O systems and as part of an LC-PLL (Phase Locked Loop), a fundamental building block in microprocessor and SOC (System on a Chip) clocking, and in wireless communication systems.

Figure 1:
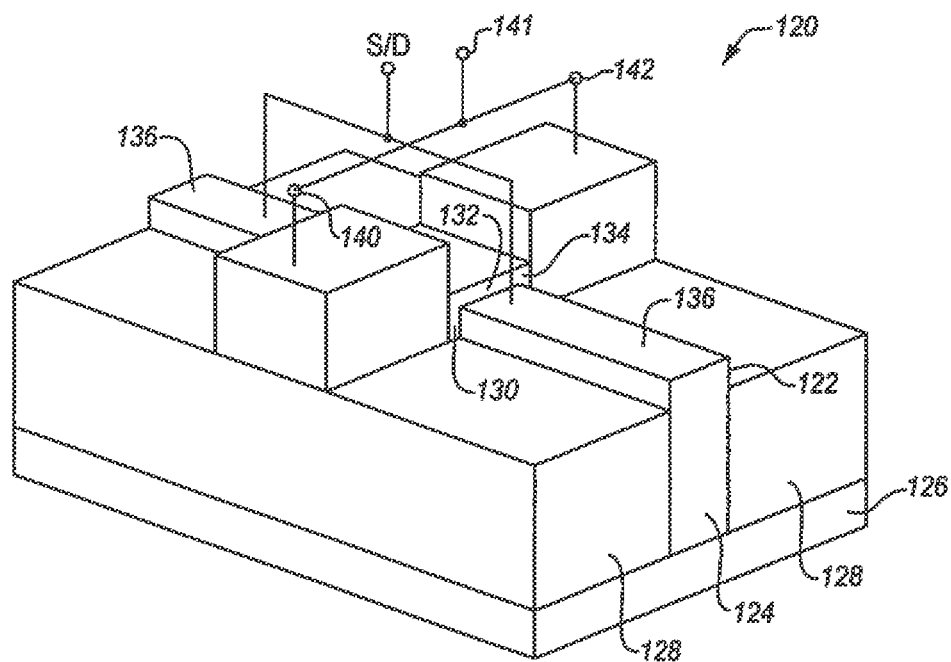
FIG. 1 is an isometric partial top view diagram of a varactor in a FinFET structure.

FIG. 1 is an isometric view of a varactor 120 formed on a FinFET structure. A semiconductor fin 122 is formed on the top portion of a semiconductor strip 124 formed over a silicon substrate 126. The fin is between STI (Shallow Trench Isolation) regions 128 formed on the substrate on either side of the fin and the trench below the fin.

A gate 132 is formed over the top of the fin and extends over the fin on both sides 130, 134. The part of the fin under the gate is the channel of the varactor. A source region and a drain region 136 are formed on opposite sides of the fin by the source/drain structure. The varactor gate has a first terminal 140 and a second terminal 142, one on either side of the gate. A common control voltage input 141 may connect to the two terminals or to only one terminal, allowing the other terminal to float. The same or a different voltage may be applied to each terminal, depending on the particular implementation. The gates may be formed by depositing a layer over the gate and then etching away some or all of the layer that is over the gate. The sidewalls of the source/drain structures are coupled by capacitance (capacitive coupling) to the sidewalls 130, 134 of the gate. The specific shapes connections and relative sizes of portions of the structure of FIG. 1 may be modified to suit different technology and application constraints and to meet various performance demands.

The source and drain regions 136 are connected through various metal lines or redistribution layers (not shown) formed over the illustrated structure. This is shown as lines connecting to a node labeled S/D. The example of FIG. 1 is a two-terminal varactor. The two source/drain terminals are shorted through the body of the device and can be considered to be a single terminal.

Figure 2:
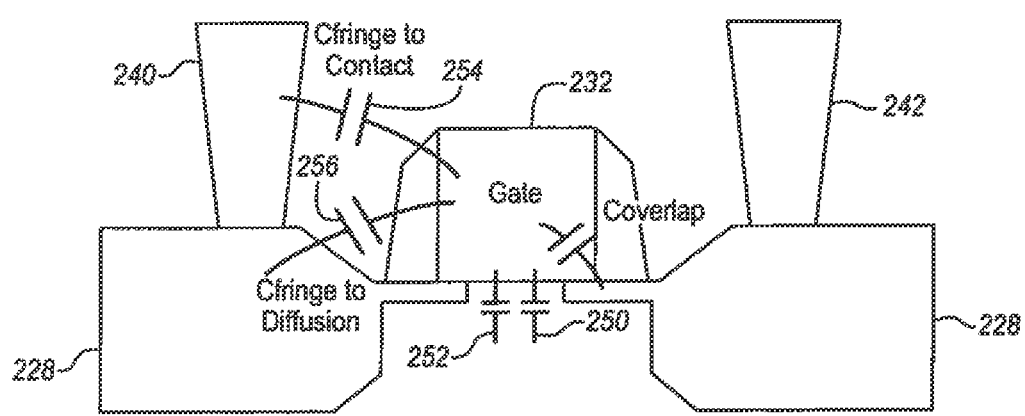
FIG. 2 is side cross-sectional diagram of a varactor showing fringe capacitances.

FIG. 2 is a side cross-sectional diagram of a second varactor taken through two source/drain terminals and a gate. Different components of the parasitic capacitance that result from CMOS technology are shown. The fringe capacitance, Cfringe, limits the capacitance tuning ratio (Cmax/Cmin) in varactors. The varactor has an intrinsic MOS capacitance 252 from the gate 232 to the underlying N-well. This is the primary capacitance that is determined by the voltage applied to the varactor control terminals.

There are fringe capacitances first between the gate 232 and each source/drain terminal 240, 242. This is indicated as a fringe capacitance 254 to the structures that are used to build up the source and drain contacts. There is also a fringe capacitance 256 from the gate 232 to the diffusion layers or raised source/drain structures of the STI 228 on each side. The capacitance depends on the physical parameters, the materials, and any isolation or barrier layers within the varactor as it is constructed in FinFET technology.

The varactor building blocks shown in FIGS. 1 and 2 are typically combined in multiple units to build larger varactor structures. Similar to large CMOS devices built of multiple legs, the larger varactors are built of multiple parallel gates (also referred to as legs) arranged in the same diffusion, with the gates interleaved by the source/drain structures.

The varactor of FIGS. 1 and 2 may be expanded by adding more gates and source/drain terminals on one or both sides of the illustrated structure. In a FinFET structure, each device leg is typically built on many parallel fins. The following figures show a varactor that is built using four device legs in the same N-well. The same structure may also be fabricated in a planar CMOS structure by forming a series of gate and source/drain terminals. The embodiments are not limited to any particular transistor and gate fabrication type or structure.

Reference is made herein to a source/drain structure, source/drain terminal, source/drain well and other source/drain elements. In embodiments, a varactor is formed by alternating doped diffusions and gates. The first diffusion area serves as a source and the last diffusion area serves as a drain. In between the first and the last, the doped diffusion areas may serve as a source or a drain. These structures are therefore referred to as source/drain structures or terminals. The term source/drain is used to refer to a source or a drain or combination of the two. The source/drain may be formed as a doped diffusion area over the N-well with a terminal or in another way, depending on the underlying structure. While the present description is presented as N+ doped structure in an N-well, where the N-well is the bulk or body of the device, the techniques, methods, and principles described herein may also be applied to P+ doped structures in a P-well. They may also be applied to varactors built as N-type devices in a P-well and built as P-type devices in an N-well, among other modifications.

Figure 3:
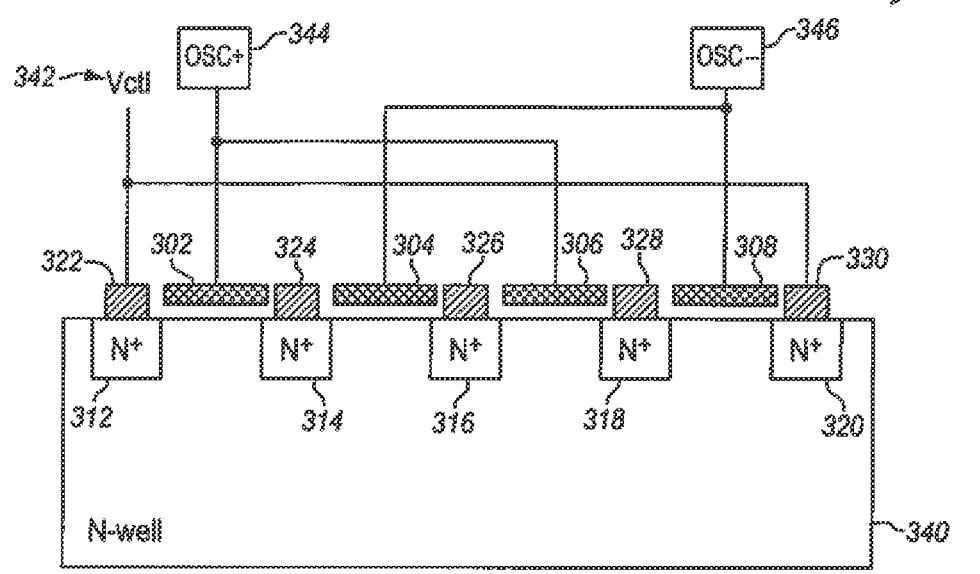
FIG. 3 is a side cross-sectional diagram of a multiple gate varactor according to an embodiment.

FIG. 3 is a cross-sectional diagram of a multiple gate varactor showing how gates are connected and driven to produce a controlled capacitance. The varactor 301 is embedded in an n-well 340 in this embodiment. The varactor is controlled by a control voltage 342 applied to terminals on source/drain terminals 322, 330 at either end of the varactor.

The varactor has four consecutive gates 302, 304, 306, 308. The gates are each formed between five doped N+ source/drain terminals or structures 312, 314, 316, 318, 320 so that the gates and the source/drain terminals alternate across respective gate terminals. Each source/drain terminal has a respective source/drain contact or electrode 322, 324, 326, 328, 330 for the connection of a control voltage from a control voltage source 342. This contact may be made by depositing a metalized layer over the respective diffusion area 322. The control voltage is ohmically coupled to the N-well or bulk 340 through the source/drain terminals by ohmic paths in the N-well. An alternating excitation is applied at the consecutive gates. A positive excitation oscillation terminal 344 is coupled to the first and third gates 302, 306. A corresponding negative excitation oscillation terminal 346 is coupled to the second and fourth gates 304, 308.

These terminals serve as the source of the excitation signal and are coupled to terminals of an oscillating power source (not shown). The alternating signal creates a virtual ac ground to the N-well at the symmetry line between positive and negative gate connections. It also amplifies the impact of the capacitance fringe components to the source/drain contacts 322, 324, 326, 328, 330 between the consecutive alternating gate connections.

Figure 4:
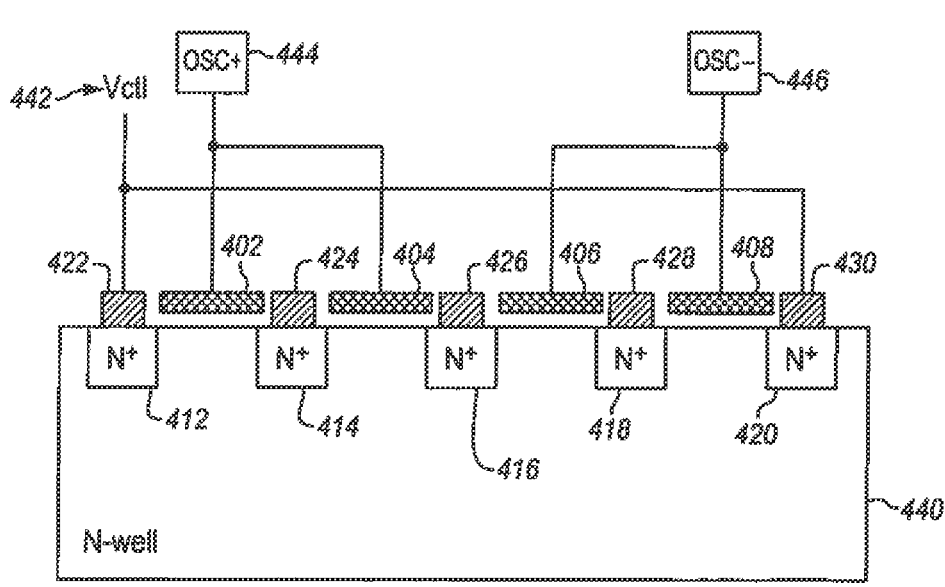
FIG. 4 is a side cross-sectional diagram of an alternative multiple gate varactor according to an embodiment.

FIG. 4 is a cross-sectional diagram of a multiple gate varactor 401 similar to that of FIG. 3. The varactor has a control voltage input source 442 and corresponding alternating excitation signal sources 444, 446. As in the example of FIG. 3, the control voltage and the alternating excitation signals are supplied by external components (not shown). The varactor has a sequence of four gates 402, 404, 406, 408 in, for example, an N-well 440. Source/drain structures 412, 414, 416, 418, 420 are fabricated on opposite sides of each of the gates by for example epitaxial deposition or another technique. The source/drain terminals may also be fabricated by forming a diffusion area through doping or deposition. Each gate has a respective source/drain contact 422, 424, 426, 428, 430 formed on its outer surface for connection to the external control voltage signals.

In this embodiment, the control voltage is connected to the first and last source/drain contacts 422, 430 as in FIG. 3 but not to any of the other source/drain contacts 424, 426, 428. As mentioned above the source drain structures have an ohmic connection to the bulk varactor, in this case an N-well. Any number and arrangement of source drain contacts may be connected to the control voltage provided that the bulk varactor or N-Well is biased. In this example, one contact at each end is sufficient to bias the bulk. The two source/drain terminals are distributed across the length of the well to bias the well using the control voltage. For a longer structure more contacts may be connected to better distribute the control voltage. Alternatively, central contacts may be connected to the control voltage instead of the end contacts. As an example, a single contact can be made at e.g. 426, or contacts 424, 428 may be connected instead of contacts 422, 430.

In contrast to the source/drain contacts, the excitation oscillation signal is connected to all of the gates. The positive excitation terminal 444 is connected to the first two adjacent gates 402, 404. The negative excitation terminal 446 is connected to the last two adjacent gates 406, 408. The gates have a capacitive coupling to the bulk varactor or N-well. The structure of the varactor may be viewed as having the N-well, the signal terminal (gate structures) and the control terminals (source/drain structures). The control terminals are ohmically coupled to the N-well and the signal terminals are capacitively coupled to the N-well.

In this example of a four leg varactor, all of the positive gate connections are on one side of the center source/drain structure 416 and all of the negative gate connections are on the other, opposite, side of the center structure. In the illustrated example, the center source/drain structure is not connected to the control voltage nor to the excitation oscillation signal. Looked at another way, the gates are coupled in consecutive pairs. For a varactor with a larger number of legs, the gates may be connected in larger groups such as triplets, quadruples, etc. This may further reduce the parasitic capacitance.

This approach of using a +,+,−,− or +,+,+−,−,− or +,+,+,+,−,−,−,−, etc. excitation across the consecutive gates, reduces the effect of the fringe capacitance components. With two or more adjacent gates having the same potential, the fringe capacitance between the two gates is not charged and discharged and its effect on the gate capacitance is eliminated.

In the four finger varactor of FIG. 4, all of the positive polarity varactor gates are adjacent and consecutive in one single group and all of the negative polarity varactor gates are adjacent and consecutive in a second single group. Instead of interleaving between single gates with positive and negative polarity, FIG. 4 shows interleaving by pairs. For an eight finger varactor, the polarities may continue to interleave by pairs so that the pattern becomes +,+,−,−,+, +,−,−. This pairs pattern may be extended to a twelve finger varactor by using three sets of positive pairs and three sets of negative pairs, and so on to suit any particular varactor configuration. Alternatively, as mentioned above, the polarities may be interleaved with three or more positive and three or more negative to each set. Using such a technique a varactor with 16, 24, 32, 40, 48, 56, 64, or any other number of gates may be constructed. The total number of gates may be even or odd. The total number of gates in each set may also be even or odd.

The groupings of two, three, or four gates may also be mixed in the same varactor structure. Some examples of mixed patterns might include:
+++−−−++−−+++−−−;
+++−−+++−−;
+++−−++−−−; and
++−−−++++−−−; etc.

Figure 5:
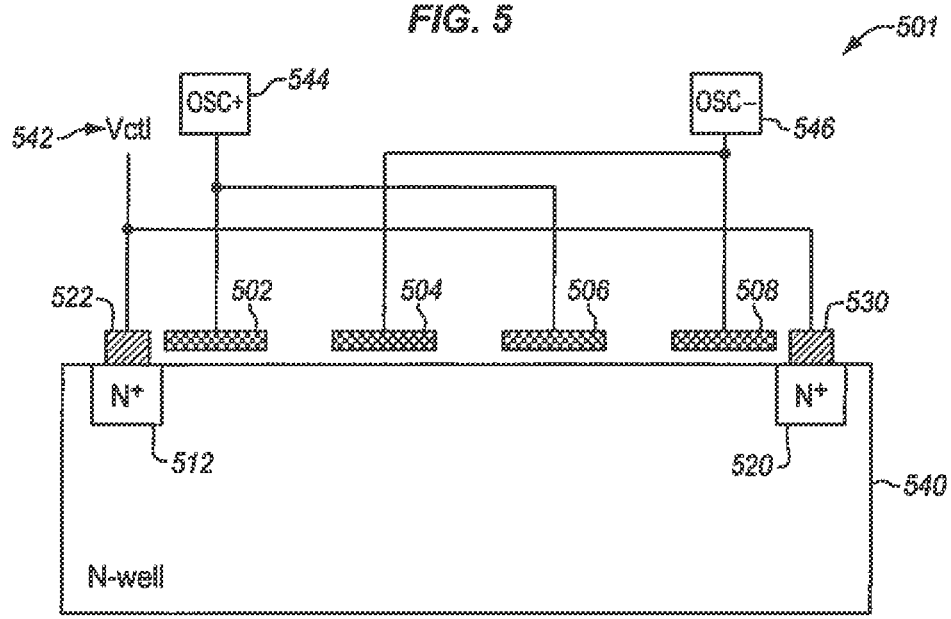
FIG. 5 is a side cross-sectional diagram of another alternative multiple gate varactor according to an embodiment.

FIG. 5 is a cross-sectional diagram of a multiple gate varactor 501 similar to that of FIG. 3. As in FIGS. 3 and 4, the varactor has a control voltage source 542 and corresponding alternating excitation source 544, 546. As in the example of FIG. 3, the control voltage and the alternating excitation signals are supplied by external components (not shown). The varactor has a sequence of four gates 502, 504, 506, 508 in an N-well 540. However, there are only two source/drain structures 512, 520 formed on opposite ends of the varactor so that there are no source/drain structures between any of the gates. The two source/drain structures on each end of the varactor each have a respective source/drain contact 522, 530 formed over the corresponding structure for connection to the external control voltage signals.

The control voltage 542 is connected to the two source/drain terminals 522, 530. As in FIGS. 3 and 4, no signal is applied between the gates. The gates are coupled together with an alternating +,−+− configuration as in FIG. 3. However, the source/drain structures, such as N+ epitaxial diffusion pads, and the corresponding source/drain contacts have not been formed between the gates. As a result, all of the gates are adjacent with no intervening source/drain terminal. Eliminating the diffusion N+ areas reduces the parasitic fringe capacitance to the diffusion STI layers. Removing the source/drain contact in the source/drain areas eliminates the fringe capacitance between the gates and the source/drain contacts except at the extreme ends of the varactor. As an alternative the source/drain terminals may be placed in a different location between some of the gates but not between all of the gates. For example one source/drain terminal may be placed between gates 502 and 504. The second may be placed between gates 506 and 508. There will be no source/drain terminal between gates 504 and 506. A variety of other configurations may also be used instead of those described and shown.

Figure 6:
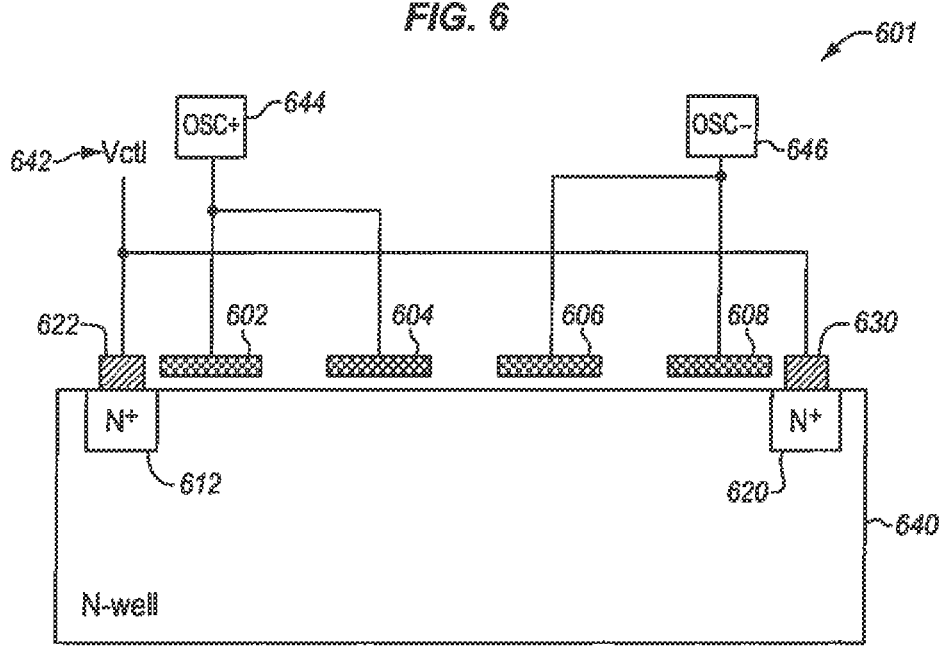
FIG. 6 is a side cross-sectional diagram of another alternative multiple gate varactor according to an embodiment.

FIG. 6 is a cross-sectional diagram of a varactor that combines the features of FIGS. 4 and 5. As in FIG. 5, the varactor has a control voltage source 642 and corresponding alternating excitation source 644, 646 powered by external components (not shown). The varactor has a sequence of four gates 602, 604, 606, 608 in an N-well 640. There are two source/drain structures 612, 620 formed on opposite sides of the varactor with no source/drain structures between any of the gates. The two source/drain structures on each end of the varactor each have a respective source/drain contact 622, 630 for connection to the external signals.

The same +,+,−,− pairwise excitation at consecutive gates as in FIG. 4 is used to reduce the effect of fringe capacitance between the gates. Removing the source/drain structures (by for example not forming the corresponding epitaxial diffusion layer) reduces the parasitic fringe capacitance between the gate and the source/drain. Removing the source/drain contact also reduces the parasitic capacitance between the gate and the source/drain contact.

As described, the performance of a varactor may be improved using one or more of the techniques described and as shown in FIGS. 4 to 6. These include removing diffusion contacts (source/drain contact), and even/odd mode excitation for consecutive source/drain terminals, among other techniques. Removing the source/drain structures (by removing the epitaxial layer) reduces the parasitic fringe capacitance between the gate and source/drain. Removing also the source/drain contact reduces the parasitic capacitance between the gate and source/drain. These techniques are able to provide as much as a 60% improvement in Cmax/Cmin. The frequency range of an LC-PLL using such a varactor is also improved by two to three times by lowering the fringe capacitance. A wider tuning range allows a circuit using the varactor to support I/O (Input/Output) and radio applications that require a wide tuning range. A wider tunable frequency range also provides a greater margin to compensate for temperature caused frequency drifts. In other words, the circuit is able to reach intended frequencies over a greater range of temperatures. For fixed or narrow range frequency circuits, reducing Cmin allows for inductance to be increased at lower power.

Figure 7:
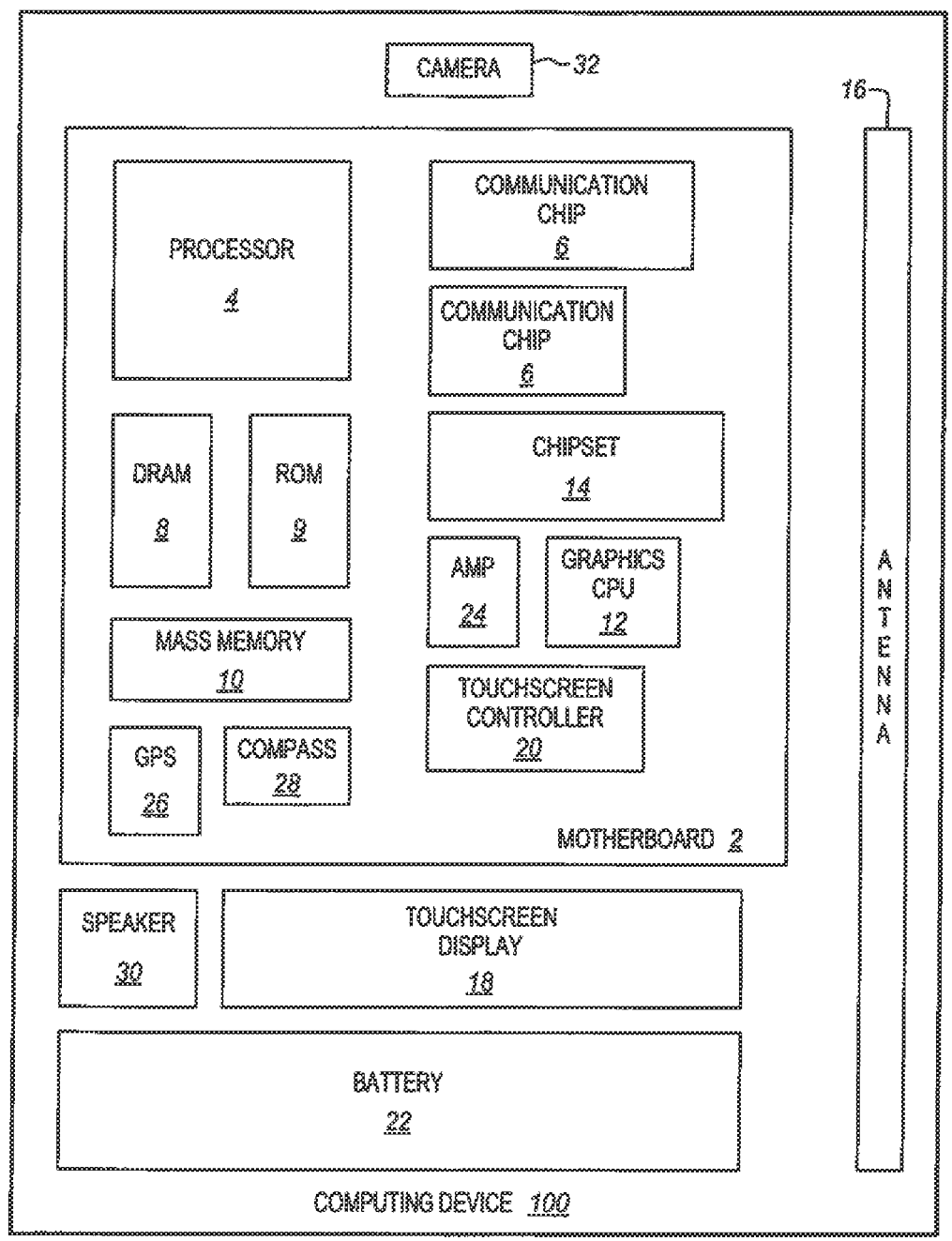
FIG. 7 is a block diagram of a computing device incorporating a multiple gate varactor according to an embodiment.

FIG. 7 illustrates a computing device 100 in accordance with one implementation of the invention. The computing device 100 houses a system board 2. The board 2 may include a number of components, including but not limited to a processor 4 and at least one communication package 6. The communication package is coupled to one or more antennas 16. The processor 4 is physically and electrically coupled to the board 2.

Depending on its applications, computing device 100 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, a camera 32, and a mass storage device (such as hard disk drive) 10, compact disk (CD) (not shown), digital versatile disk (DVD) (not shown), and so forth). These components may be connected to the system board 2, mounted to the system board, or combined with any of the other components.

The communication package 6 enables wireless and/or wired communications for the transfer of data to and from the computing device 100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication package 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 100 may include a plurality of communication packages 6. For instance, a first communication package 6 may be dedicated to shorter range wireless communications such as Wi-Fi and Bluetooth and a second communication package 6 may be dedicated to longer range wireless communications such as GPS, EDGE, GPRS, CDMA, WiMAX, LTE, Ev-DO, and others.

Any one or more of the chips may include varactors as described herein or varactors may be used in IC packages for use with interfaces, or communications.

In various implementations, the computing device 100 may be a server, a workstation, a laptop, a netbook, a notebook, an ultrabook, a smartphone, a tablet, a personal digital assistant (PDA), an ultra mobile PC, a mobile phone, a printer, a scanner, a monitor, a set-top box, an entertainment control unit, a digital camera, a portable music player, or a digital video recorder. In further implementations, the computing device 100 may be any other electronic device, such as a pen, a wallet, a watch, or an appliance that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to a varactor that includes a well, a plurality of gates formed over the well and having a capacitive connection to the well, the gates comprising a first subset of the gates that are adjacent and consecutive and coupled to a positive pole of an excitation oscillation signal, and a second subset of the gates that are adjacent and consecutive and coupled to a negative pole of the excitation oscillation signal, and a plurality of source/drain terminals formed over the well and having an ohmic connection to the well, each coupled to a respective gate to receive a control voltage to control the capacitance of the varactor.

In further embodiments the consecutive gates of the first subset are coupled to the positive pole without any intervening gates coupled to negative poles.

Further embodiments include a center source/drain terminal centered in the varactor and wherein the gates of the first set are on one side of the center source/drain terminal and the gates of the second set are on the other side of the center source/drain terminal.

In further embodiments each of the plurality of gates is formed over a fin of a FinFET structure.

In further embodiments each of the plurality of gates is formed over a respective leg of a planar structure.

In further embodiments the first subset of the gates comprises two gates on two adjacent legs on one side of the varactor and the second subset of gates comprises two gates on two other adjacent legs of the other side of the varactor.

Further embodiments include a third subset of the gates that are adjacent and consecutive and coupled to a positive pole of an excitation oscillation signal, and a fourth subset of the gates that are adjacent and consecutive and coupled to a negative pole of the excitation oscillation signal, wherein the first and second subsets are adjacent and the third and fourth subsets are adjacent.

In further embodiments the first and second subsets each comprise a pair of gates, the varactor comprising additional pairs of gates, wherein the pairs alternate in polarity for each respective pair.

In further embodiments the first and second subsets comprise each comprise three gates, the varactor comprising additional subsets of three gates, wherein the subsets alternate in polarity for each respective subset.

Some embodiment pertain to a computing device that includes a circuit board, a packaged die coupled to the circuit board, the die including an excitation oscillation signal source, a control voltage source and a varactor, the varactor comprising a well, a plurality of gates formed over the well and having a capacitive connection to the well, the gates comprising a first subset of the gates that are adjacent and consecutive and coupled to a positive pole of an excitation oscillation signal from the excitation oscillation signal source, and a second subset of the gates that are adjacent and consecutive and coupled to a negative pole of the excitation oscillation signal, and a plurality of source/drain terminals formed over the well and having an ohmic connection to the well to receive a control voltage from the control voltage source to control the capacitance of the varactor.

Further embodiments include additional subsets of gates, each subset having two adjacent gates and alternating in polarity between adjacent subsets.

Further embodiments include a third subset of the gates that are adjacent and consecutive and coupled to a positive pole of an excitation oscillation signal, and a fourth subset of the gates that are adjacent and consecutive and coupled to a negative pole of the excitation oscillation signal, wherein the first and second subsets are adjacent and the third and fourth subsets are adjacent.

Some embodiments pertain to a method that includes driving a positive excitation oscillation signal on a first subset of plurality of gates of a varactor, the first subset of the gates being adjacent and consecutive the plurality of gates being formed over a well and having a capacitive connection to the well, driving a negative excitation oscillation signal on a second subset of the plurality of gates of the varactor, the second subset being adjacent and consecutive, and driving a control gate voltage on a plurality of source/drain terminals to control the capacitance of the varactor the source/drain terminals being formed over the well and having an ohmic connection to the well.

In further embodiments each of the plurality of gates is formed over a respective leg of a planar structure.

In further embodiments the first and second subsets comprise alternating pairs of gates in which the polarity is interleaved between the pairs.

Some embodiments pertain to a varactor that includes a well, a plurality of gates formed over the well and having a capacitive connection to the well, each gate being coupled to an excitation oscillation signal, and a plurality of source/drain terminals formed over the well, each separated from the next by at least one of the plurality of gates to receive a control voltage to control the capacitance of the varactor, wherein a subset of the gates are adjacent with no intervening source/drain terminal.

In further embodiments the source/drain terminals are adjacent to the first and the last gates at opposite ends of the varactor.

In further embodiments the source/drain terminals comprise raised source/drain structures with a metallized contact layer.

In further embodiments the source/drain terminals comprise an epitaxial diffusion layer that is ohmically coupled to the well.

In further embodiments the source/drain terminals are distributed across the well to bias the well using the control voltage.

In further embodiments the plurality of gates comprise a first subset of the gates that are adjacent and consecutive and coupled to a positive pole of an excitation oscillation signal, and a second subset of the gates that are adjacent and consecutive and coupled to a negative pole of the excitation oscillation signal.

In further embodiments the consecutive gates of the first subset are coupled to the positive pole without any intervening gates coupled to negative poles.

In further embodiments each of the plurality of gates is formed over a fin of a FinFET structure.

Some embodiments pertain to a computing device that includes a circuit board, a packaged die coupled to the circuit board, the die including an excitation oscillation signal source, a control voltage source and a varactor, the varactor comprising a well, a plurality of gates formed over the well and having a capacitive connection to the well, each gate being coupled to an excitation oscillation signal, and a plurality of consecutive adjacent source/drain terminals formed over the well, each separated from the next by at least one of the plurality of gates, the first and the last of the consecutive source/drain terminals to receive a control voltage to control the capacitance of the varactor, the first and last source/drain terminals having an epitaxial diffusion layer covered by a raised source/drain structure for connection to the control voltage, the control gates other than the first and the last not having a raised source/drain structure.

In further embodiments a subset of the gates are adjacent with no intervening source/drain terminal.

In further embodiments the source/drain terminals are adjacent to the first and the last gates.

In further embodiments the source/drain terminals comprise doped diffusion area over the well.

What is claimed is:

1. A varactor comprising:
a plurality of gates comprising a first subset of the gates that are adjacent and coupled to a positive pole of an excitation oscillation signal, and a second subset of the gates that are adjacent and coupled to a negative pole of the excitation oscillation signal, wherein the plurality of gates is over an N-well, the N-well in a fin, and the N-well having an N-type dopant concentration; and
first and second source/drain terminals to receive a same control voltage to control the capacitance of the varactor, the first source/drain terminal coupled directly to the second source/drain terminal, wherein the first source/drain terminal comprises a first N-doped region in the N-well and the second source/drain terminal comprises a second N-doped region in the N-well, the first and second N-doped regions having a greater N-type dopant concentration than the N-type dopant concentration of the N-well, wherein the plurality of gates is between the first source/drain terminal and the second source/drain terminal, wherein there are no source/drain terminals between any of the plurality of gates of the varactor, wherein the first subset of the gates is adjacent to the first source/drain terminal without additional gates coupled to the negative pole of the excitation oscillation signal between the first subset of the gates and the first source/drain terminal, wherein the second subset of the gates is adjacent to the second source/drain terminal without additional gates coupled to the positive pole of the excitation oscillation signal between the second subset of the gates and the second source/drain terminal, and wherein the second subset of the gates is immediately adjacent to the first subset of the gates.

2. The varactor of claim 1, wherein the first subset of the gates comprises two gates on one side of the varactor and the second subset of gates comprises two gates on the other side of the varactor.

3. A computing device comprising:
a circuit board;

a packaged die coupled to the circuit board, the die including an excitation oscillation signal source, a control voltage source and a varactor, the varactor comprising:

a plurality of gates comprising a first subset of the gates that are adjacent and coupled to a positive pole of an excitation oscillation signal from the excitation oscillation signal source, and a second subset of the gates that are adjacent and coupled to a negative pole of the excitation oscillation signal, wherein the plurality of gates is over an N-well, the N-well in a fin, and the N-well having an N-type dopant concentration; and first and second source/drain terminals to receive a same control voltage from the control voltage source to control the capacitance of the varactor, the first source/drain terminal coupled directly to the second source/drain terminal, wherein the first source/drain terminal comprises a first N-doped region in the N-well and the second source/drain terminal comprises a second N-doped region in the N-well, the first and second N-doped regions having a greater N-type dopant concentration than the N-type dopant concentration of the N-well, wherein the plurality of gates is between the first source/drain terminal and the second source/drain terminal, wherein there are no source/drain terminals between any of the plurality of gates of the varactor, wherein the first subset of the gates is adjacent to the first source/drain terminal without additional gates coupled to the negative pole of the excitation oscillation signal between the first subset of the gates and the first source/drain terminal, wherein the second subset of the gates is adjacent to the second source/drain terminal without additional gates coupled to the positive pole of the excitation oscillation signal between the second subset of the gates and the second source/drain terminal, and wherein the second subset of the gates is immediately adjacent to the first subset of the gates.

4. A method comprising:

driving a positive excitation oscillation signal on a first subset of a plurality of gates of a varactor, the first subset of the gates being adjacent, wherein the plurality of gates is over an N-well, the N-well in a fin, and the N-well having an N-type dopant concentration;

driving a negative excitation oscillation signal on a second subset of the plurality of gates of the varactor, the second subset being adjacent, wherein the first and second subsets of the gates are between a first source/drain terminal and a second source/drain terminal, wherein the first subset of the gates is adjacent to the first source/drain terminal without additional gates coupled to the negative excitation oscillation signal between the first subset of the gates and the first source/drain terminal, wherein the second subset of the gates is adjacent to the second source/drain terminal without additional gates coupled to the positive excitation oscillation signal between the second subset of the gates and the second source/drain terminal, and wherein the second subset of the gates is immediately adjacent to the first subset of the gates; and driving a same control voltage on a first source/drain terminal and a second source/drain terminal to control the capacitance of the varactor, the first source/drain terminal coupled directly to the second source/drain terminal, wherein the first source/drain terminal comprises a first N-doped region in the N-well and the second source/drain terminal comprises a second N-doped region in the N-well, the first and second N-doped regions having a greater N-type dopant concentration than the N-type dopant concentration of the N-well, and wherein there are no source/drain terminals between any of the plurality of gates of the varactor.

* * * * *